(12) United States Patent
Yasukawa et al.

(10) Patent No.: US 6,774,405 B2
(45) Date of Patent: Aug. 10, 2004

(54) LIGHT-EMITTING DEVICE

(75) Inventors: Takemasa Yasukawa, Nishikasugai-gun (JP); Hideki Omoya, Nishikasugai-gun (JP); Satoshi Honda, Niiza (JP); Koji Tsukagoshi, Kawagoe (JP); Tsutomu Yokota, Iruma-gun (JP)

(73) Assignees: Toyoda Gosei Co., Ltd., Aichi-ken (JP); Sanken Electric Co., Ltd., Niiza (JP)

( * ) Notice: Subject to any disclaimer, the term of this patent is extended or adjusted under 35 U.S.C. 154(b) by 0 days.

(21) Appl. No.: 10/087,925

(22) Filed: Mar. 5, 2002

(65) Prior Publication Data

US 2002/0121645 A1 Sep. 5, 2002

(30) Foreign Application Priority Data

Mar. 5, 2001 (JP) .................................... P.2001-060972

(51) Int. Cl.⁷ ..................... H01L 33/00; H01L 23/495; H01L 21/00

(52) U.S. Cl. ..................... 257/99; 257/98; 257/100; 257/676; 257/791; 257/792; 257/793; 438/22; 438/25; 438/26; 438/28; 438/29; 438/34

(58) Field of Search ........................... 257/98–100, 676, 257/791–793; 438/22, 25, 26, 28, 29, 34, 35

(56) References Cited

U.S. PATENT DOCUMENTS

| 4,888,634 | A | * | 12/1989 | Lai et al. | 357/72 |
| 5,813,753 | A | * | 9/1998 | Vriens et al. | 362/293 |
| 6,066,861 | A | * | 5/2000 | Hohn et al. | 257/98 |
| 6,345,903 | B1 | * | 2/2002 | Koike et al. | 362/249 |
| 2002/0134988 | A1 | * | 9/2002 | Ishinaga | 257/99 |

* cited by examiner

Primary Examiner—Donghee Kang
(74) Attorney, Agent, or Firm—McGinn & Gibb, PLLC

(57) ABSTRACT

A light-emitting element is mounted in a cup-like portion formed on a substrate and a case. The cup-like portion is filled with a sealing member made of a light-transmissible resin. A layer made of a material having a refractive index lower than that of the sealing member is provided between the sealing member and a surface of the case.

13 Claims, 6 Drawing Sheets

BEFORE PEELING

AFTER PEELING

LIGHT-EMITTING DEVICE

The present application is based on Japanese Patent Application No. 2001-60972, which is incorporated herein by reference.

BACKGROUND OF THE INVENTION

1. Field of the Invention

The present invention relates to a light-emitting device provided with a light-emitting element. The light-emitting device according to the invention may be used, for example, as a light source for illumination or as a light source for any kind of display device.

2. Description of the Related Art

A configuration shown in FIG. 6 is known as the configuration of a light-emitting device using a light-emitting element. FIG. 6 typically shows an SMD (surface mounted device) type LED 100. In the LED 100, a cup-like portion 150 is formed on a substrate 120 and a case (reflector) 130, and a light-emitting element 110 is disposed in the cup-like portion 150. Further, the cup-like portion 150 is filled with a sealing member 140 (of a light-transmissible resin).

A surface of the case 130 facing the light-emitting element 110 are selected to have such a shape and a material so that light irradiated from the light-emitting element 110 onto the surface can be reflected by the surface so as to be used as light in a direction of an optical axis. For example, a shape shown in FIG. 6 is made of a white resin which contains a white filler dispersed in a polymer resin. The case 130 configured as described above is used so that light irradiated from the light-emitting element 110 onto the surface of the case 130 can be partially converted into light in the direction of the optical axis so as to be radiated to the outside.

In the LED configured as described above, a part of light which has been emitted from the light-emitting element 110 and has reached the surface of the case 130 is irregularly reflected or diffused by the surface of the case 130, so that the part of light cannot be used as light radiated to the outside. This unfavorable result is assumed to be caused by the light reflected by the surface of the case 130 which is a surface of the filler grains (different from a flat surface having a predetermined angle to irradiated light). As described above, it cannot be said that the light-emitting device having the related-art configuration can utilize light emission of the light-emitting element sufficiently and effectively. There is still a room for improvement in emission efficiency.

SUMMARY OF THE INVENTION

The invention is developed in consideration of these circumstances, and an object of the invention is to provide a light-emitting device which can emit light with high luminance by effectively using light emitted from a light-emitting element.

To achieve the foregoing object, the invention uses the following configuration.

A light-emitting device having:
a light-emitting element;
a case including a cup-like portion having a bottom on which the light-emitting element is mounted;
a sealing member with which the cup-like portion is filled so that the light-emitting element is covered with the seal material; and
a low-refractive-index layer having a refractive index lower than that of the sealing member and formed between the sealing member and a surface of the case shaping a side surface of the cup-like portion.

In this configuration, the sealing member and the low-refractive-index layer are disposed between the light-emitting element and the surface of the case shaping the cup-like portion, in the order of increasing distance from the light-emitting element side. Hence, light emitted from the light-emitting element and traveling toward the surface of the case (that is, light emitted in a direction of alienation from an optical axis) passes through the sealing member and is made incident on the low-refractive-index layer. On this occasion, among light incident from the sealing member side onto the low-refractive-index layer, rays having incidence angles of not lower than a predetermined angle are totally reflected by the interface between the sealing member and the low-refractive-index layer because the refractive index of the low-refractive-index layer is lower than that of the sealing member. That is, the interface serves as a reflection surface, so that light incident on the low-refractive-index layer can be reflected by the interface so as to be converted into light in the direction of the optical axis. As a result, externally radiant efficiency is enhanced so that light can be emitted with high luminance. According to the inventors' examination, it has been found that a light-emitting device with very high luminance is formed by use of this configuration. Details of this finding will be understood by referring to the following description of embodiments.

As described above, a light-emitting device with high light-emitting efficiency can be provided because the configuration of the invention is quite different from the related-art configuration in that the interface between the sealing member and the low-refractive-index layer is used as a reflection surface.

Features and advantages of the invention will be evident from the following detailed description of the preferred embodiments described in conjunction with the attached drawings.

DETAILED DESCRIPTION OF THE PREFERRED EMBODIMENTS

Figure 1:
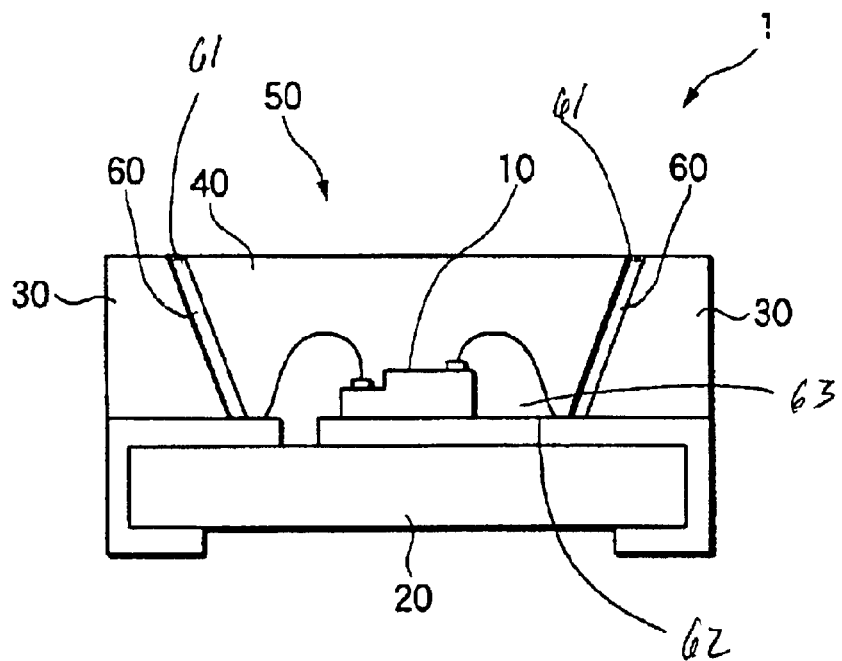
FIG. 1 is a view typically showing the configuration of a light-emitting diode which is an embodiment of the invention.

Constituent members of a light-emitting device according to the invention will be described below.

(Light-Emitting Element)

A light-emitting element of any configuration can be used without any particular limitation on kind. For example, a light-emitting element including at least one Group III nitride compound semiconductor layer may be used.

(Case)

The case is a member including a cup-like portion having a bottom on which the light-emitting element is mounted. The cup-like portion has a bottom and a side surface to thereby form a space shaped so that the area of a section perpendicular to an optical axis increases continuously or stepwise viewed from the bottom toward a position where light emerges from the light-emitting device. In a range satisfying this condition, the bottom and the side surface are not particularly limited in shape.

The concept "case" in this specification contains a case constituted by a combination of a plurality of members in the case where a cup-like portion is formed by such a combination of the plurality of members, as well as a case constituted by a single member having a cup-like portion. Specific examples of the case include: a case which is formed by arranging another member to thereby form a cup-like portion on an approximately flat substrate or lead frame (in this case, a part of a surface of the substrate or lead frame forms a bottom of the cup-like portion and a part of a surface of the other member forms a side surface of the cup-like portion); and a case constituted by a lead frame having a portion molded into a cup shape.

The material for forming the case is not particularly limited but a portion of the case shaping the side surface of the cup-like portion may be preferably made of a reflective material, more preferably a material with high reflectance. When the case is made of a reflective material, a surface of the case serves as a reflection surface. Hence, light which has been emitted from the light-emitting element and has reached the surface of the case can be reflected by the surface of the case, so that the light can be converted into light in the direction of the optical axis. As a result, improvement in externally radiant efficiency of the light-emitting device can be attained. It is preferable from the point of view of reflecting efficiency that the surface of the case is made as smooth as possible. This is because total reflection occurs more easily on the surface of the case as the surface of the case is smoother. Further, the angle of the surface of the case can be designed in consideration of reflecting efficiency in the direction of the optical axis. The angle is preferably selected to be in a range of from 20° to 60°, more preferably in a range of from 40° to 50°, with respect to the optical axis of the light-emitting element.

For example, a material containing a white filler can be used as the reflective material. For example, white liquid-crystal polymer, or white material-containing Polyphthalamide may be used. Alternatively, a metal such as aluminum or silver may be used as the reflective material.

Incidentally, when the low-refractive-index layer is constituted by a gap between the sealing member and the surface of the case as will be described later, it is preferable that the linear expansion coefficient of the reflective material of the case is small. It is also preferable that the adhesion of the reflective material of the case to the sealing member is low. This is because the low-refractive-index layer constituted by the gap can be formed easily when the sealing member is thermally hardened and contracted in the condition that such a reflective material is used.

(Sealing Member)

The sealing member is a member with which the cup-like portion of the case is filled so that the light-emitting element is covered with the sealing member. The sealing member is provided mainly for the purpose of protecting the light-emitting element from the external environment. The material of the sealing member is not particularly limited so long as the material can transmit light. For example, silicone resin, epoxy resin, urea resin or glass can be used as the material of the sealing member. Because these materials have different characteristics against light, temperature, etc. from one another, suitable one may be selected from these materials in consideration of the emission wavelength of the light-emitting element used and the use condition of the light-emitting element.

The sealing member may be made of a plurality of materials. For example, the sealing member may be provided as follows. A plurality of layers made of different materials are laminated on the light-emitting element to thereby form the sealing member on the light-emitting element. In this case, a layer of a material having durability against light emission of the light-emitting element may be preferably provided in the vicinity of the light-emitting element. When, for example, an element emitting ultraviolet light is used as the light-emitting element, a layer of a silicone resin relatively durable against ultraviolet light may be preferably provided in the vicinity of the light-emitting element.

The sealing member may contain a fluorescent substance. The use of the fluorescent substance permits a part of light from the light-emitting element to be converted into light with a different wavelength and permits the color of light emitted from the light-emitting device to be changed or corrected. Any material can be used as the fluorescent substance if the material can be excited by light emitted from the light-emitting element. The fluorescent substance is selected in consideration of the color of light emitted from the light-emitting device, the durability of the light-emitting device, and so on. The fluorescent substance may be dispersed uniformly in the sealing member or may be localized in a partial region of the sealing member. When, for example, the fluorescent substance is localized in the vicinity of the light-emitting element, light emitted from the light-emitting element can be irradiated onto the fluorescent substance efficiently.

The sealing member may contain a combination of various kinds of fluorescent substances. In this case, a fluorescent substance emitting light when the fluorescent substance is excited by light emitted from the light-emitting element, and another fluorescent substance emitting light when the other fluorescent substance is excited by light emitted from the first-mentioned fluorescent substance may be used in combination.

The sealing member may contain a light-diffusing material so that diffusion of light in the sealing member can be accelerated to reduce light emission unevenness. Particularly in the configuration in which the fluorescent substance is used as described above, the light-diffusing material can be preferably used in order to accelerate color mixing of light emitted from the light-emitting element and light emitted from the fluorescent substance to thereby reduce emission color unevenness.

(Low-Refractive-Index Layer)

The low-refractive-index layer has a refractive index lower than that of the sealing member. The low-refractive-index layer is formed between the sealing member and the surface of the case shaping the side surface of the cup-like portion. The low-refractive-index layer is provided for reflecting apart of light, emitted from the light-emitting element, by the interface between the sealing member and the low-refractive-index layer to thereby convert the part of light into light in the direction of the optical axis.

The low-refractive-index is not particularly limited if the refractive index of the low-refractive-index layer is lower than that of the sealing member. For example, a resin having a refractive index lower than that of the sealing member can be used as the material of the low-refractive-index layer. Preferably, a material having a refractive index largely different from that of the sealing member may be used. In a preferred mode, a gap is provided between the sealing member and the surface of the case shaping the cup-like portion so that the gap is used as the low-refractive-index layer. That is, an air layer provided between the sealing member and the surface of the case is used as the low-refractive-index layer. When, for example, a silicone or epoxy resin is used as the sealing member on this occasion, the refractive index difference between the sealing member and the low-refractive-index layer is large because the refractive index of the resin used is in a range of from about 1.4 to about 1.5 whereas the refractive index of air is 1.0. Hence, light emitted from the light-emitting element and made incident from the sealing member side onto the low-refractive-index layer can be totally reflected easily, so that a larger part of light can be reflected by the interface between the sealing member and the low-refractive-index layer and used as light in the direction of the optical axis.

When a gap between the sealing member and the surface of the case shaping the side surface of the cup-like portion is provided as the low-refractive-index layer in such a manner, the end of the gap on the emission observation surface side (that is, the end of the cup-like portion on the side opposite to the bottom side) is preferably filled with a light-transmissible material 61, as shown in FIG. 1. That is, it preferable that the gap (low-refractive-index layer) is sealed on the emission observation surface side. As a result, external dust, dirt, moisture or the like can be prevented from entering the gap, so that improvement in reliability and durability of the light-emitting device can be attained.

Further, when the gap is provided as the low-refractive-index layer, it is also preferable that, on the bottom side 62 of the cup-like portion, the sealing member adheres to the surface of the case shaping the side surface of the cup-like portion, as shown in FIG. 1. This arrangement is made for the purpose of preventing peeling of the sealing member and, accordingly, improving stability of the light-emitting device. When, for example, shrinkage of the bottom side of the cup-like portion is selectively suppressed in the case where a liquid-like sealing member can be hardened in the condition that the sealing member adheres to the surface of the case on the bottom side of the cup-like portion. When, for example, grains or fine particles of a light-transmissible material 63 such as glass beads are localized on the bottom side of the cup-like portion (e.g. as shown in FIG. 1) in the case where the sealing member is thermally hardened, the sealing member can be shrunk selectively as described above. On this occasion, the linear expansion coefficient of the grains or fine particles of the light-transmissible material is preferably smaller than that of the sealing member.

For example, the low-refractive-index layer can be formed by the following method.

First, the light-emitting element is mounted in the cup-like portion of the case. Then, a liquid-like sealing member is dripped into the cup-like portion, and heated to be hardened in the condition that the sealing member adheres to the surface of the case shaping the side surface of the cup-like portion. Then, the sealing member is cooled to be thermally shrunk, so that a gap is generated between the sealing member and the surface of the case. Incidentally, the sealing member may be peeled from the surface of the case by inserting a sharp-edged member between the sealing member and the surface of the case. By this method, a low-refractive-index layer made of an air layer (gap) can be formed between the sealing member and the surface of the case shaping the side surface of the cup-like portion.

Alternatively, a material having a refractive index lower than that of the sealing member may be applied onto the surface of the case shaping the side surface of the cup-like portion to thereby provide a low-refractive-index layer in advance. Then, the cup-like portion may be filled with the sealing member to thereby provide the low-refractive-index layer between the sealing member and the surface of the case.

The configuration of the invention will be described below in more detail with reference to an SMD type light-emitting diode which is an embodiment of the invention.

FIG. 1 is a view typically showing a section of a light-emitting diode 1. Briefly, the light-emitting diode 1 includes a light-emitting element 10, a substrate 20, a reflector 30, a sealing member 40, and an air layer (gap) 60. The combination of the substrate 20 and the reflector 30 is equivalent to the case in the description. Incidentally, the light-emitting diode 1 contains a Zener diode not shown for electrostatic withstand voltage.

Figure 2:
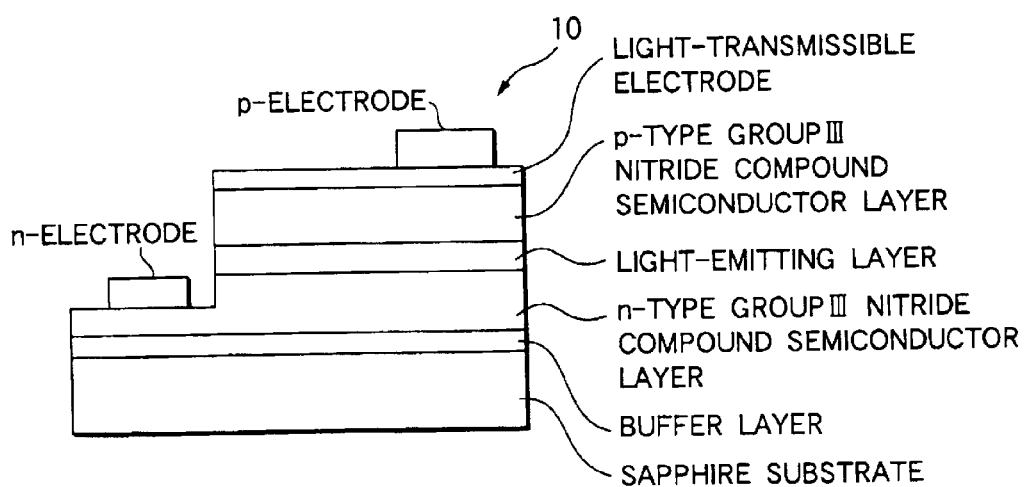
FIG. 2 is a view typically showing the configuration of a light-emitting element constituting the light-emitting diode.

The light-emitting element 10 is a Group III nitride compound semiconductor light-emitting element. FIG. 2 typically shows the configuration of the light-emitting element 10. As shown in FIG. 2, the light-emitting element 10 includes a sapphire substrate, and a plurality of Group III nitride compound semiconductor layers laminated on the sapphire substrate.

The substrate 20 is an electrically insulating substrate. Desired wiring patterns are printed on a surface of the substrate 20. The light-emitting element 10 is mounted in a desired position of the substrate 20.

The reflector 30 is disposed on the substrate 20 so that the cup-like portion 50 is constituted by the reflector 30 and a part of the surface of the substrate 20.

The reflector 30 is made of Vectra (tradename, made by Polyplastics Co., Ltd.) which is a white liquid-crystal polymer. The reflector 30 is molded so that the surface forming the cup-like portion 50 makes a desired angle to the optical axis. In this embodiment, the angle of the surface is selected to be about 30° with respect to the optical axis of the light-emitting element 10.

The sealing member 40 is made of a silicone resin. In this embodiment, a silicone resin available on the market is used.

The air layer 60 is made of a gap provided between the sealing member 40 and the surface of the reflector 30. The light-emitting diode 1 is produced by the following method.

First, the reflector 30 is disposed on the substrate 20. Then, the light-emitting element 10 is mounted and electrodes of the light-emitting element 10 are connected to wiring patterns on the substrate 20 by lead wires. Then, a liquid-like silicone resin (sealing member) is potted in the cup-like portion 50. Then, the silicone resin is heated at about 150° C. to be thermally hardened. As a result, the silicone resin becomes familiar with the surface of the reflector 30 and is hardened in the condition that the silicone resin adheres to the surface of the reflector 30. Then, the silicone resin is cooled to a room temperature. As a result, the silicone resin is thermally shrunk, so that the silicone resin is peeled from the surface of the reflector 30. As a result, a gap (air layer 60) is generated between the sealing member 40 and the surface of the reflector 30.

Figure 3:
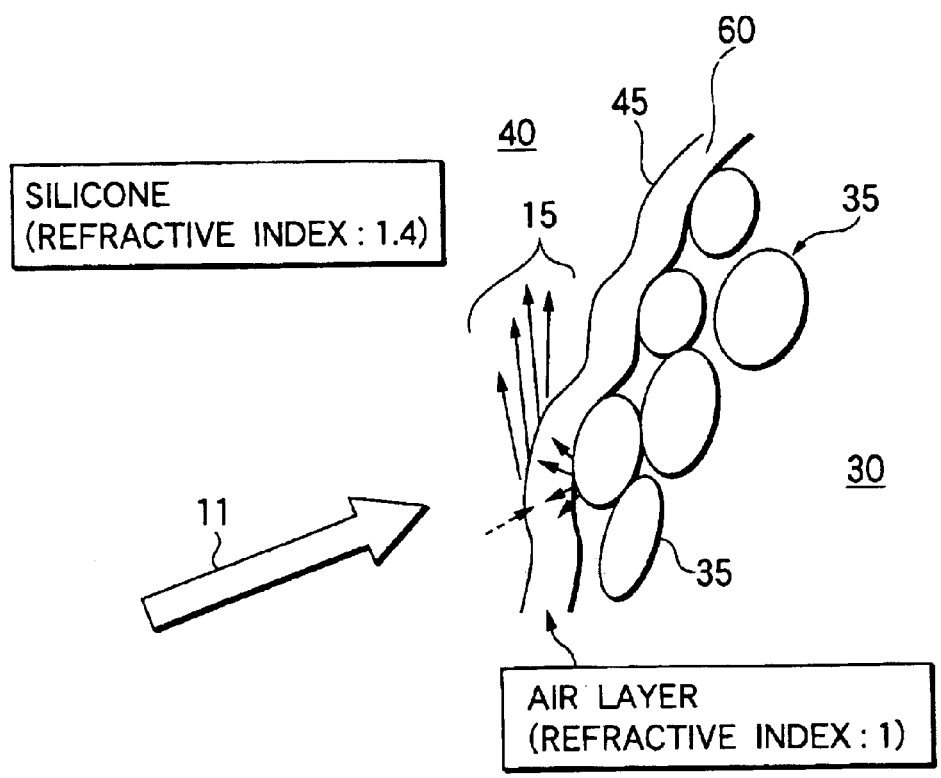
FIG. 3 is a view for explaining a state of radiation of light in the light-emitting diode.

The state of light radiation of the light-emitting diode 1 will be described below with reference to FIG. 3. FIG. 3 is an enlarged view typically showing a portion of the air layer 60. FIG. 3 shows a state in which light 11 emitted from the light-emitting element 10 and traveling toward the reflector 30 is totally reflected by the interface 45 between the sealing member 40 and the air layer 60 to thereby be converted into light 15 in the direction of the optical axis. In the light-emitting diode 1, the refractive index difference between the sealing member 40 and the air layer 60 is large because the refractive index of the sealing member 40 is about 1.4 (silicone resin) whereas the refractive index of the air layer 60 is 1.0 (air). Hence, total reflection of light as shown in FIG. 3 occurs easily on the interface 45 between the sealing member 40 and the air layer 60, so that a large part of light emitted from the light-emitting element 10 and traveling toward the reflector 30 can be converted into light in the direction of the optical axis. The light in the direction of the optical axis can be radiated to the outside. Incidentally, the reference numeral 35 in FIG. 3 designates a white filler contained in the reflector 30.

Figure 4A:
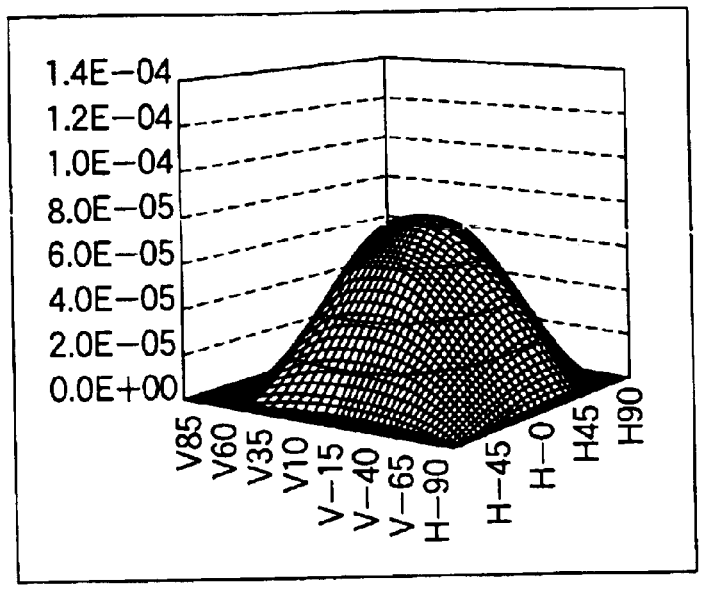
FIGS. 4A and 4B are graphs showing the difference between characteristics of luminous intensity distributions of light-emitting diodes before and after a sealing member is peeled from a surface of a reflector in the embodiment, FIG. 4A being a graph showing characteristic of the three-dimensional luminous intensity distribution before peeling, FIG. 4B graphically shows characteristic of the three-dimensional luminous intensity distribution after peeling.
Figure 4B:
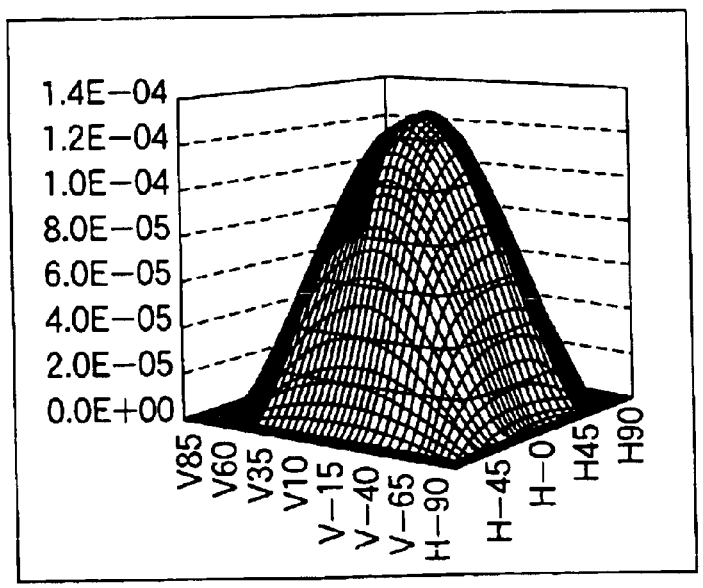

Then, light-emitting diodes before and after the sealing member 40 was peeled from the surface of the reflector 30 (that is, a light-emitting diode without the air layer 60 and a light-emitting diode with the air layer 60) were prepared. The light-emitting characteristics of the two light-emitting diodes were examined. FIGS. 4A and 4B show results of the examination. FIG. 4A is a graph showing characteristic three-dimensional luminous intensity distribution of the light-emitting diode before peeling. FIG. 4B is a graph showing characteristic of three-dimensional luminous intensity distribution of the light-emitting diode after peeling. Results of luminous intensity measured at observation points arranged at intervals of 5° in each of horizontal and vertical directions set on the emission observation surface side of each light-emitting diode are shown as a three-dimensional graph.

In the light-emitting diode before peeling, the luminous intensity on the optical axis was $8.01 \times 10^{-7}$ (W/strad), and the total radiant flux was $2.1 \times 10^{-6}$ (W). On the other hand, in the light-emitting diode after peeling, the luminous intensity on the optical axis was $1.32 \times 10^{-6}$ (W/strad), and the total radiant flux was $3.42 \times 10^{-6}$ (W). Hence, the luminous intensity on the optical axis after peeling is 1.65 times as much as that before peeling, and the total radiant flux after peeling is 1.59 times as much as that before peeling. It is proved that both the luminous intensity on the optical axis and the total radiant flux increase significantly when the sealing member 40 is peeled from the surface of the reflector 30 so that the air layer 60 is provided between the sealing member 40 and the reflector 30.

Figure 5:
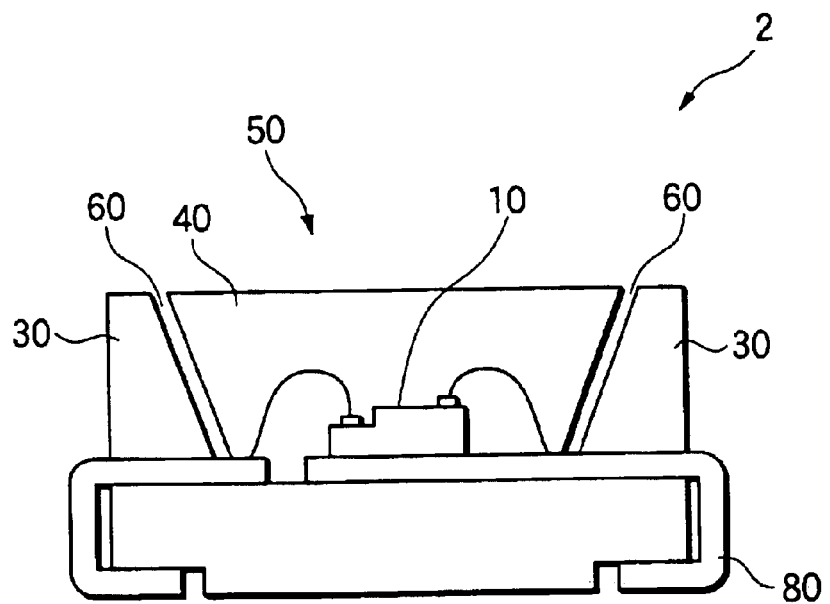
FIG. 5 is a view typically showing the configuration of a light-emitting diode which is another embodiment of the invention.
Figure 6:
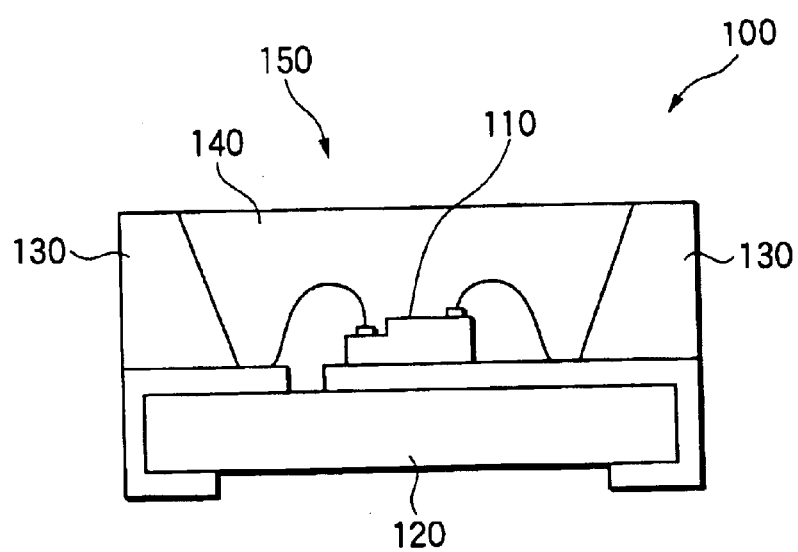
FIG. 6 is a view showing a light-emitting diode having a related-art configuration.

FIG. 5 is a typical view showing a light-emitting diode 2 having another configuration. In FIG. 5, parts of the light-emitting diode 2 the same as those of the light-emitting diode 1 are referenced correspondingly. In the light-emitting diode 2, a lead frame 80 is used instead of the substrate. The light-emitting element 10 is mounted on the lead frame 80. The other configuration is the same as that of the light-emitting diode 1.

Although an SMD type light-emitting diode has been described as embodiments to which the invention is applied, the invention may be applied also to a so-called round type light-emitting diode in which a light-emitting element is mounted on a lead frame having a cup-like portion and in which the light-emitting element and a part of the lead frame are covered with a sealing member. The invention may be further applied to a flip chip type light-emitting element in which a light-emitting diode is mounted on a substrate or lead frame in the form of a so-called flip chip.

The invention is not at all limited to the description on the mode for carrying out the invention and may contain various modifications that can be conceived easily by those skilled in the art, without departing from the scope of claim for a patent.

What is claimed is:

1. A light-emitting device comprising:
   a light-emitting element;
   a case comprising a cup-like portion having a bottom on which said light-emitting element is mounted;
   a sealing member with which said cup-like portion is filled so that said light-emitting element is covered with said sealing member; and
   a low-refractive-index layer having a refractive index lower than that of said sealing member and formed between said sealing member and a surface of said case shaping a side surface of said cup-like portion,
   wherein said low-refractive-index layer comprises a gap between said sealing member and said surface of said case, and
   wherein said gap has an end on an emission observation surface side, said end being filled with a light-transmissible material.

2. A light-emitting device according to claim 1, wherein said surface of said case comprises a reflective surface.

3. A light-emitting device according to claim 1, wherein said sealing member comprises at least one material selected from the group consisting of silicone resin, epoxy resin, urea resin, and glass.

4. A light-emitting device according to claim 1, wherein said sealing member comprises a fluorescent substance.

5. A light-emitting device according to claim 1, wherein said light-emitting element comprises at least one Group III nitride compound semiconductor layer.

6. A light-emitting device according to claim 1, wherein an angle between said side surface of said cup-like portion and an optical axis is in a range from 20 to 60 degrees.

7. A light-emitting device according to claim 1, wherein said lighting element comprises a flip chip light-emitting diode.

8. A light-emitting device according to claim 1, wherein a difference between a refractive index of said sealing member and a refractive index of said low-refractive-index layer is at least 0.4.

9. A light-emitting device according to claim 1, wherein a shrinkage of said sealing member is selectively suppressed in an area of said bottom of said cup-like portion.

10. A light-emitting device according to claim 1, wherein said side-surface of said cup-like portion comprises one of aluminum and silver.

11. A light-emitting device according to claim 1, further comprising:
    a lead frame which defines said bottom of said cup-like portion, said light-emitting element being formed on said lead frame.

12. A light-emitting device comprising:
    a light-emitting element;
    a case comprising a cup-like portion having a bottom on which said light-emitting element is mounted;
    a sealing member with which said cup-like portion is filled so that said light-emitting element is covered with said sealing member; and
    a low-refractive-index layer having a refractive index lower than that of said sealing member and formed between said sealing member and a surface of said case shaping a side surface of said cup-like portion,
wherein said sealing member comprises one of grains and fine particles of a light-transmissible material, and
wherein said one of said grains and fine particles are localized on the bottom side of said cup-like portion.

13. A light-emitting device according to claim 12, wherein said one of said grains and fine particles comprises a linear expansion coefficient smaller than that of said sealing member.

* * * * *